United States Patent
Kawasaki

(10) Patent No.: US 6,879,539 B2
(45) Date of Patent: Apr. 12, 2005

(54) SEMICONDUCTOR MEMORY DEVICE WITH SENSE AMPLIFIER

(75) Inventor: Satoshi Kawasaki, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/603,745

(22) Filed: Jun. 26, 2003

(65) Prior Publication Data

US 2004/0141349 A1 Jul. 22, 2004

(30) Foreign Application Priority Data

Jan. 16, 2003 (JP) ........................................ 2003-007787

(51) Int. Cl.⁷ ............................................... G11C 8/00
(52) U.S. Cl. .................................. 365/230.03; 365/63
(58) Field of Search ............................. 365/230.03, 63, 365/230.06

(56) References Cited

U.S. PATENT DOCUMENTS 6,226,208 B1 * 5/2001 Nakai et al. ................. 365/191
6,288,925 B1 * 9/2001 Kitsukawa et al. ........... 365/63

FOREIGN PATENT DOCUMENTS

| JP | 9-64308 | 3/1997 |
| JP | 2000-22108 | 1/2000 |

* cited by examiner

Primary Examiner—Michael S. Lebentritt
Assistant Examiner—Pho M. Luu
(74) Attorney, Agent, or Firm—McDermott Will & Emery LLP

(57) ABSTRACT

A semiconductor memory device that can be reduced in chip area while preventing degradation in characteristic is obtained. In DRAM, a plurality of memory cell array regions are arranged in matrix, spaced apart from each other in a row direction and in a column direction, on a semiconductor substrate. A sense amplifier region is arranged in a gap between the memory cell array regions in the column direction. An element forming a sense amplifier is arranged in the sense amplifier region. A subdecoder region is arranged in a gap between the memory cell array regions in the row direction. A cross region is arranged at an intersection of the sense amplifier regions in line and the subdecoder regions in line. A sense amplifier driver element is arranged in the subdecoder region and used in a sense amplifier operation.

6 Claims, 10 Drawing Sheets

SEMICONDUCTOR MEMORY DEVICE WITH SENSE AMPLIFIER

BACKGROUND OF THE INVENTION

1. Field of the Invention

The present invention relates to a semiconductor memory device, and more particularly to a semiconductor memory device that can be miniaturized and improved in characteristics.

2. Description of the Background Art

Semiconductor memory devices such as DRAM (Dynamic Random Access Memory) are conventionally known (see Japanese Patent Laying-Open No. 9-64308, for example).

In the semiconductor memory device described in Japanese Patent Laying-Open No. 9-64308, in a memory array configuration in matrix, sense amplifier driving circuits for driving sense amplifiers and I/O control circuits for outputting data from the sense amplifiers are arranged at a plurality of intersection regions of subword drivers dispersedly arranged in a word line direction of the memory array (between memory arrays) and sense amplifiers dispersedly arranged in a data line direction of the memory array (between memory arrays) (intersection regions of strip-like regions partitioning memory arrays in the word line direction and strip-like regions partitioning memory arrays in the data line direction). If the sense amplifier driving circuits and the like are concentratedly arranged at the intersection regions in this manner, a total area for the regions provided with memory arrays, subword drivers, sense amplifiers, and the like may effectively reduced.

With further miniaturization of semiconductor devices, however, the width of the region provided with subword driver has become narrower. Moreover, with improvement of an element material forming a memory cell in a memory cell array, the number of division (the number of memory cell arrays) in the word line direction tends to be reduced. Therefore it has become difficult to arrange all the elements constituting a sense amplifier driving circuit at an intersection region.

A part of the elements constituting a sense amplifier driving circuit may be arranged in a region in which a sense amplifier is arranged (a region in which an element forming a sense amplifier (a sense amplifier-forming element) is formed). In this case, in order to minimize the total area, it is necessary to arrange components such as sense amplifier-forming elements and contact holes for fixing well potential, as densely as possible. In this way, the elements constituting sense amplifier driving circuits can well be accommodated, while the total area can be reduced to some extent. As a result of efficiently arranging the components in the region in which the sense amplifier is arranged as described above, however, the shapes of N-well and P-well that are required to arrange the element such as P-channel MOS transistor and N-channel transistor have often been complicated. As a result, the distances between a plurality of transistors (elements) constituting a sense amplifier and a well boundary portion are varied. Here, the inventor has found that if the distance between the well boundary portion and the transistor is small to some extent as described later, the threshold voltage of the transistor varies with the distance between the well boundary portion and the transistor. It follows that if the distances between a plurality of transistors (elements) and the well boundary portion are varied as described above, the characteristics (the threshold voltage) of the transistors forming the sense amplifier are varied. This may lead to degradation in characteristic of the semiconductor memory device.

SUMMARY OF THE INVENTION

An object of the present invention is to provide a semiconductor memory device that can be reduced in chip area (an area necessary for forming an element) while preventing degradation of characteristic.

A semiconductor memory device in accordance with the present invention includes a plurality of memory cell array regions, sense amplifier regions, subdecoder regions, cross regions, and sense amplifier driver elements. A plurality of memory cell array regions are arranged in matrix, spaced apart from each other in a row direction and in a column direction, on a semiconductor substrate. A plurality of sense amplifier regions each are arranged in a gap between memory array regions in the column direction. A sense amplifier-forming element is arranged in the sense amplifier region. A plurality of subdecoder regions each are arranged in a gap between memory cell array regions in the row direction. A plurality of intersection regions each are positioned at an intersection of a plurality of sense amplifier regions in line and a plurality of subdecoder regions in line. A plurality of sense amplifier driver elements are arranged in the subdecoder region to be used in an operation of the sense amplifier (to drive the sense amplifier).

In this manner, the subdecoder region is used as a region in which a sense amplifier driver element is arranged, so that the area of the sense amplifier region can be reduced as compared with a case where a sense amplifier driver element is arranged with the sense amplifier-forming element in the sense amplifier region. Furthermore, the sense amplifier driver element is arranged in a region (the subdecoder region) other than the sense amplifier region, the degree of freedom of arrangement of the sense amplifier-forming element in the sense amplifier region can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
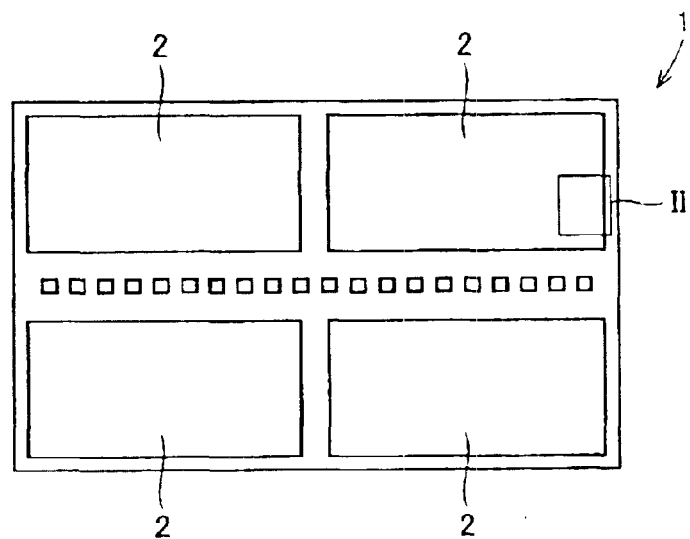
FIG. 1 is a planar schematic view of a DRAM chip as a semiconductor memory device in accordance with the present invention.

In the following, an embodiment of the present invention will now be described with reference to the figures. It is noted that in the figures the same or corresponding parts will be denoted with the same reference numerals and description thereof will not be repeated.

Referring to FIGS. 1–5, a semiconductor memory device in accordance with the embodiment of the present invention will be described.

Referring to FIG. 1, the semiconductor memory device in accordance with the present invention is a DRAM in a dispersed word line driving scheme (or a divided word driver scheme), on which chip a plurality of memory cell mats 2 and regions formed with periphery circuits are arranged. Although there are four memory cell mats 2 in a DRAM chip 1 shown in FIG. 1, there may be any number of memory cell mats. Memory cell mat 2 is specifically formed of a plurality of memory cell array regions 3 arranged in a grid (in matrix). Memory cell array regions 3 are separated from each other by a sense amplifier band (referred to as an SA band hereinafter) in a vertical direction in FIG. 2. Memory cell array regions 3 are separated from each other by a subdecoder band (referred to as an SWD band hereinafter) in a horizontal direction in FIG. 2. Therefore, a sense amplifier region 4, a subdecoder region 5, and a cross region 6 at which SA band and SWD band intersect are arranged between memory cell array regions 3.

Figure 3:
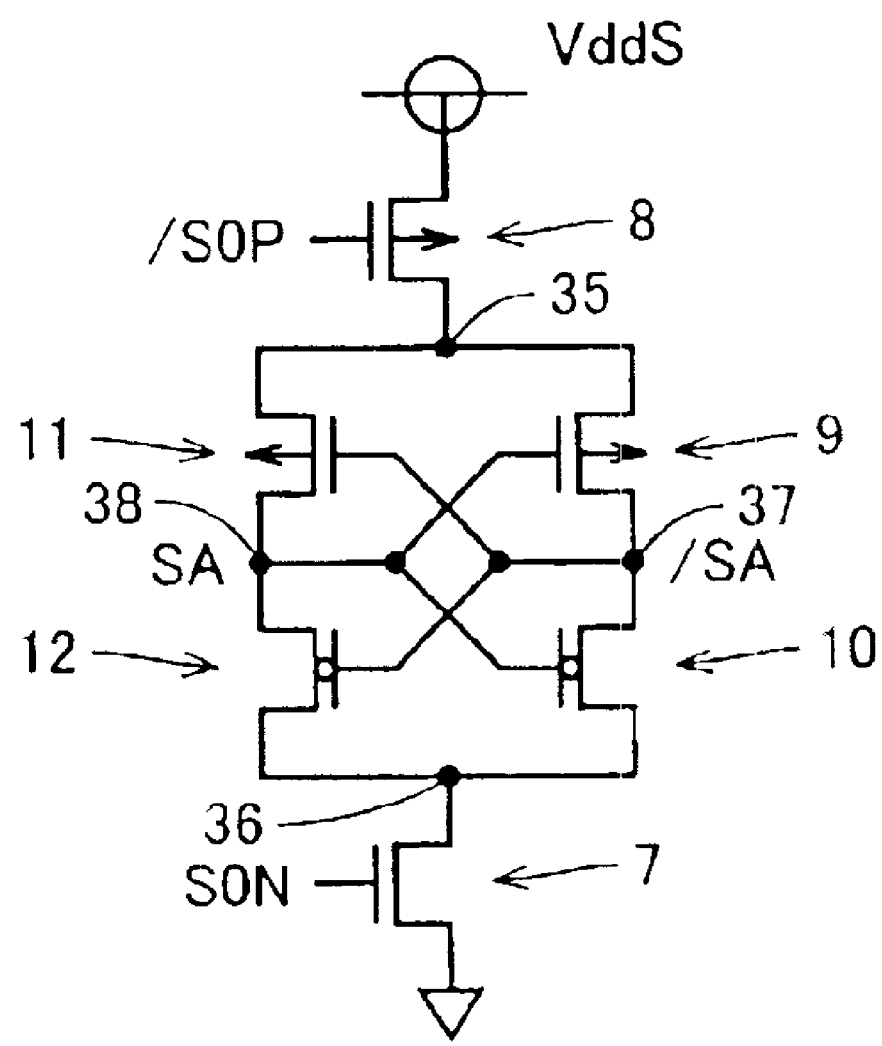
FIG. 3 is a circuit diagram of a sense amplifier arranged between memory cell array regions of the chip shown in FIG. 1.

A plurality of sense amplifiers for increasing a potential difference between a bit line pair for a memory cell arranged in memory cell array region 3 and a plurality of sense amplifier driver transistors for driving the sense amplifiers are arranged in sense amplifier region 4, subdecoder region 5 and cross region 6 positioned between memory cell array regions 3. FIG. 3 shows the sense amplifier and the sense amplifier driver transistor described above.

Referring to FIG. 3, an S2P driver transistor 8 as a sense amplifier driver transistor is rendered conductive in response to a sense amplifier activation signal/SOP. S2P driver transistor 8 is a P-channel MOS transistor. An S2N driver transistor 7 as a sense amplifier driver transistor is rendered conductive in response to a sense amplifier activation signal SON. S2N driver transistor 7 is an N-channel MOS transistor. A sense amplifier circuit includes a P-channel transistor 9 and an N-channel transistor 10 connected in series between a node 35 connected to S2P driver transistor 8 and a node 36 connected to S2N driver transistor 7, and having their gates connected together to a node 38. The sense amplifier circuit further includes a P-channel transistor 11 and an N-channel transistor 12 connected in series between node 35 and node 36 and having their gates connected together to a node 37.

The sense amplifier circuit is provided between a bit line pair (for example between BL and ZBL). Node 38 is connected, for example, to BL, which is one bit line. Node 37 is connected to the other bit line ZBL. The sense amplifier circuit increases a potential difference between the bit line pair described above when activated.

Specifically, the sense amplifier circuit, S2P driver transistor 8, and S2N driver transistor 7 described above are arranged as shown in FIG. 4.

Figure 4:
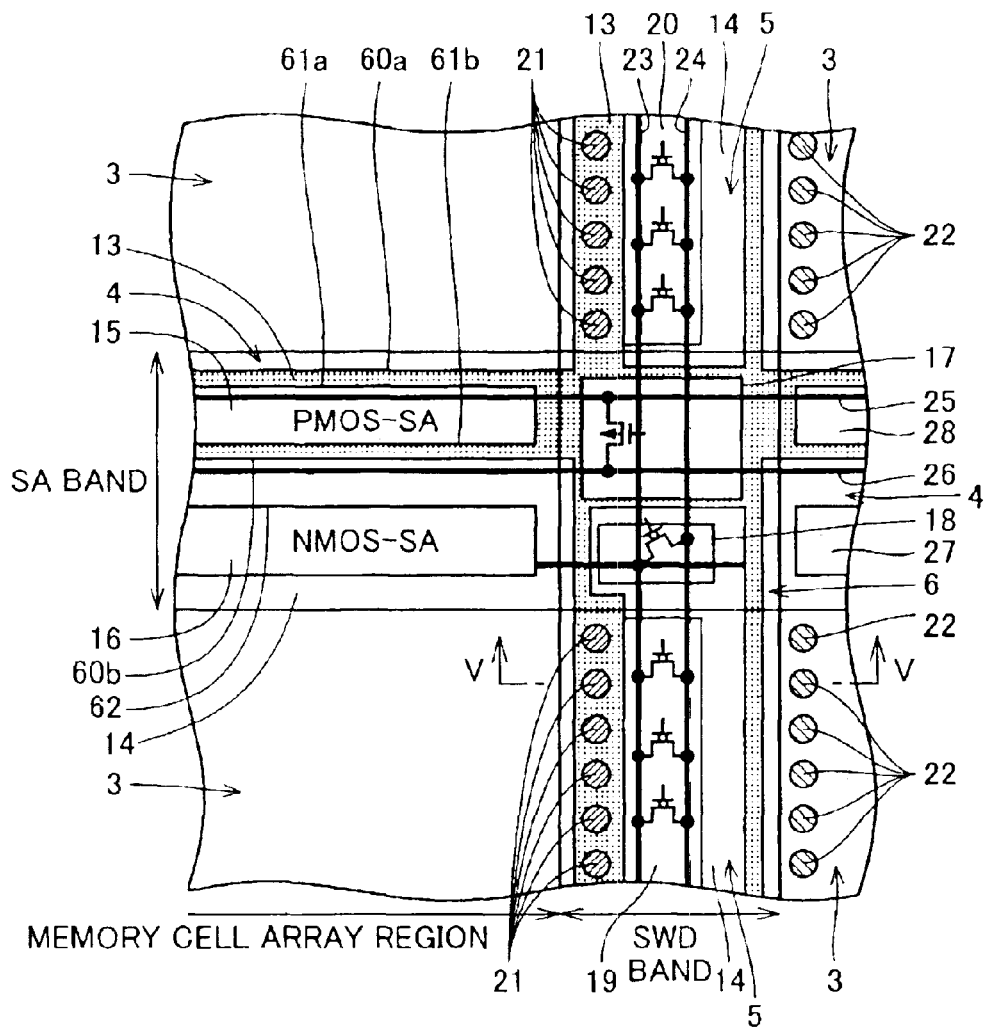
FIG. 4 is an enlarged schematic view showing a part of the partially enlarged schematic view of the chip shown in FIG. 2.

FIG. 4 shows memory cell array region 3, and sense amplifier region 4, subdecoder region 5 and cross region 6 positioned between memory cell array regions 3. As can be seen from FIG. 4, in sense amplifier region 4, subdecoder region 5 and cross region 6, an N well region 13 is formed by implanting an N-type conductive impurity in a prescribed region in a semiconductor substrate. Furthermore, in sense amplifier region 4, subdecoder region 5 and cross region 6, the region other than N well 13 is a P well 14.

P-channel transistors 9, 11 (P-channel MOS transistors) constituting the sense amplifier circuit shown in FIG. 3 are concentratedly arranged in a region 15 labeled with PMOS-SA. N-channel transistors 10, 12 (N-channel MOS transistors) constituting the sense amplifier circuit shown in FIG. 3 are concentratedly arranged in a region 16 labeled with NMOS-SA in FIG. 4.

A plurality of S2P driver transistors 8 (see FIG. 3) as sense amplifier drivers are concentratedly arranged in a concentrated S2P region 17 positioned in N well 13 at cross region 6. A plurality of S2N driver transistors 7 (see FIG. 3) as sense amplifier drivers are dispersedly arranged in an S2N region 18 positioned in P well 14 at cross region 6 and dispersed S2N regions 19, 20 respectively arranged in P wells 14 at two subdecoder regions 5 arranged with cross region 6 interposed therebetween.

In subdecoder region 5, a $V_{DDS}$ fixing portion 21 is arranged on N well 13. In a dummy interconnection portion of memory cell array region 3, a $V_{BB}$ fixing portion 22 is arranged. As shown in FIG. 4, an S2N line 23 and a GND line 24 are arranged on subdecoder region 5 and cross region 6 in the SWD band extending direction. A ZS2P line 25 and a $V_{DDS}$ line 26 are arranged on sense amplifier region 4 and cross region 6 in the SA band extending direction.

Figure 5:
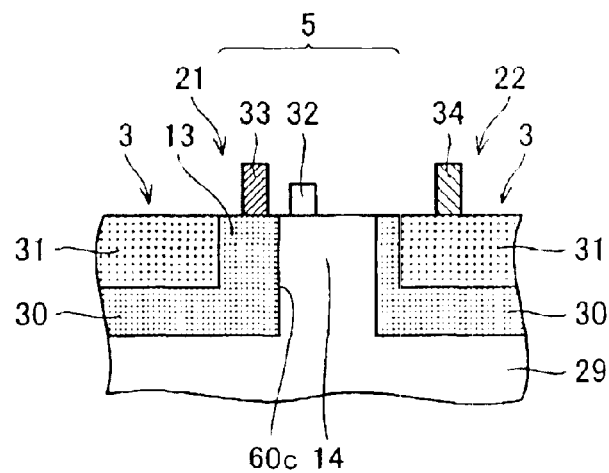
FIG. 5 is a cross sectional schematic view taken along a line V—V in FIG. 4.

As can be seen from FIG. 5, N well 13 in subdecoder region 5 is connected with a bottom N well 30 in the memory cell array region (see FIG. 4). A conductor plug 33 forming $V_{DDS}$ fixing portion 21 is arranged to connect to N well 13. An interlayer insulating film is formed on a main surface of a semiconductor substrate 29, though not shown. Conductor plug 33 is arranged inside a contact hole formed in the interlayer insulating film. Conductor plug 33 is connected to an interconnection on the upper layer positioned on the main surface of semiconductor substrate 29.

A conductor plug 34 forming $V_{BB}$ fixing portion 22 is arranged in contact with a P well 31 on the surface of semiconductor substrate 29. Conductor plug 34 is arranged to fill in the contact hole formed in the interlayer insulating film (not shown). Conductor plug 34 is electrically connected to the interconnection on the upper layer positioned on the main surface of semiconductor substrate 29. An N-channel MOS transistor 32 as S2N driver transistor is arranged in dispersed S2N region 19 (see FIG. 4) of subdecoder region 5, as shown in FIG. 5.

As can be seen from FIGS. 4 and 5, in the semiconductor memory device in accordance with the present invention, the sense amplifier transistors forming a sense amplifier circuit are arranged in the sense amplifier region, while S2N region 18 and dispersed S2N regions 19, 20 provided with S2N driver transistors and concentrated S2P region 17 provided with S2P driver transistors are arranged in cross region 6 and subdecoder region 5. $V_{DDS}$ fixing portion 21 and $V_{BB}$ fixing portion 22 are also arranged in the region other than sense amplifier region 4 (the end portions of subdecoder region 5 and memory cell array region 3). In other words, neither the sense amplifier driver transistor nor $V_{DDS}$ fixing portion 21 and $V_{BB}$ fixing portion 22 as the well potential fixing portions are arranged in sense amplifier region 4. Therefore, the area of sense amplifier region 4 can be reduced.

Sense amplifier transistors can be arranged in sense amplifier region 4 such that the distance between a well boundary 60a that is a boundary portion between N well 13 and P well 14 and an outer peripheral portion 61a of region 15 in which P-channel sense amplifier transistors are arranged is approximately uniform throughout region 15. Similarly, the distance between a well boundary 60b and an outer peripheral portion 61b of region 15 can also be made uniform throughout region 15. Similarly, the distance between an outer peripheral portion 62 of region 16 in which N-channel sense amplifier transistors of the sense amplifier transistors are arranged and well boundary 60b can also be made uniform throughout region 16. In regions 15, 16, a plurality of sense amplifier transistors can be arranged approximately parallel to the direction in which well boundaries 60a, 60b extend. As a result, the distance between the sense amplifier transistors forming sense amplifier and well boundary 60a or 60b (i.e. the distance between the channel region of the sense amplifier transistor and well boundary 60a or 60b) can be made approximately uniform for a plurality of sense amplifier transistors. Therefore, variations in characteristic of sense amplifier transistors due to the distance variations described above can be prevented.

As shown in FIG. 5, in $V_{DDS}$ fixing portion 21, a portion in abutment with a wall of bottom N well 30 is formed in a portion (N well 13) exposed on the surface of semiconductor substrate 29 in subdecoder region 5. N well 13 in subdecoder region 5 is formed irrespective of the presence of $V_{DDS}$ fixing portion 21. Therefore, it is not necessary to enlarge the area of subdecoder region 5 in order to secure a place for arranging $V_{DDS}$ fixing portion 21. In other words, $V_{DDS}$ fixing portion 21 can be arranged in subdecoder region 5 having an area approximately equal to the conventional one.

Figure 6:
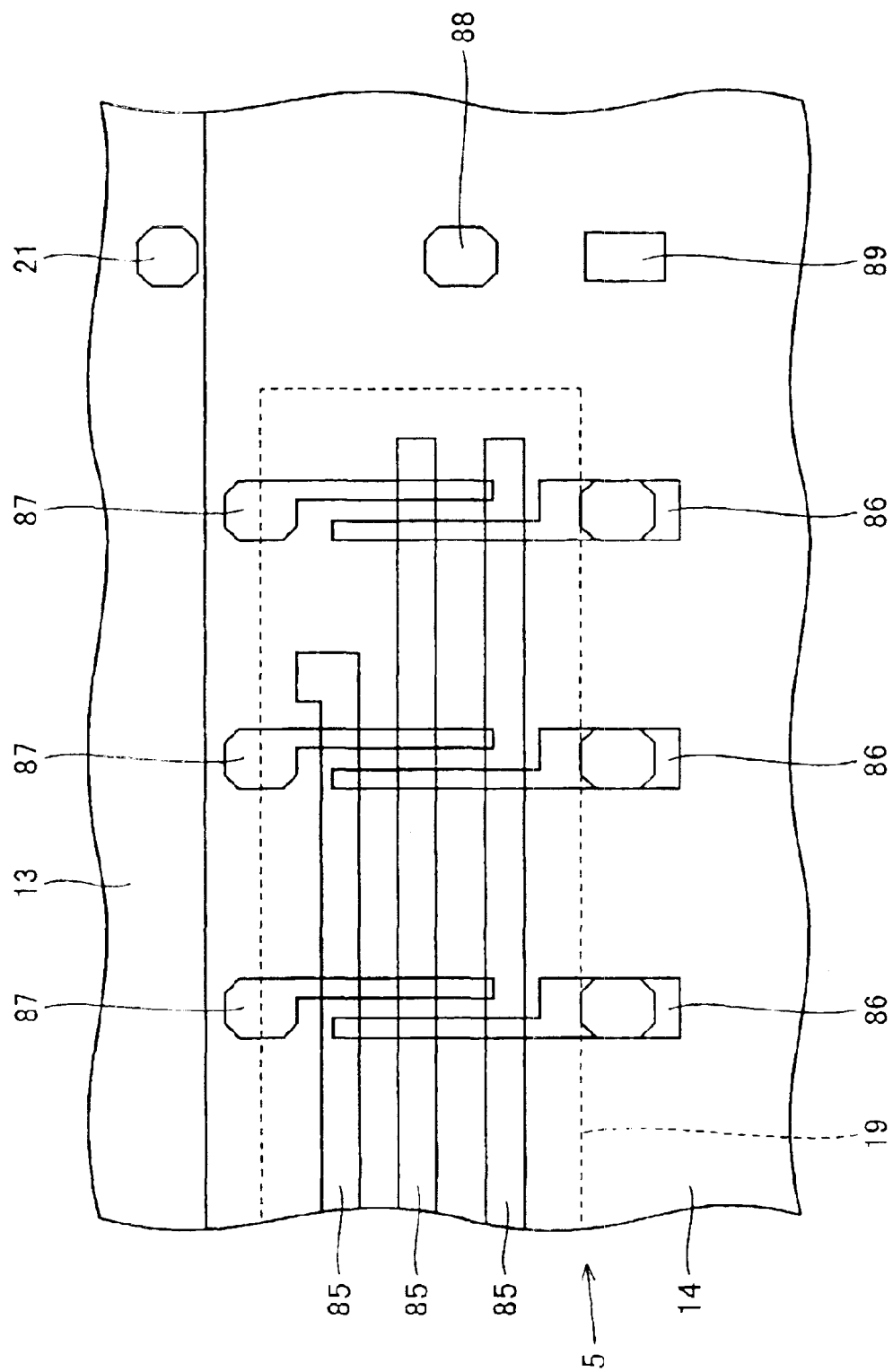
FIG. 6 is a schematic view showing an arrangement of elements in a subdecoder region of the semiconductor memory device shown in FIG. 4.

An exemplary arrangement of S2N driver transistor and the like in subdecoder region 5 may include, for example, an arrangement as shown in FIG. 6. Referring to FIG. 6, subdecoder region 5 of the semiconductor memory device in the present invention is divided into N well 13 and P well 14. $V_{DDS}$ fixing portion 21 is formed in N well 13. Dispersed S2N region 19, a GND well fixing portion 88 and a $V_{PP}$ well fixing portion 89 are formed in P well 14. A GND node 87 and an S2N node 86 are formed on the main surface of the semiconductor substrate in dispersed S2N region 19. GND node 87 and S2N node 86 are conductive impurity diffusion regions formed in the main surface of the semiconductor substrate and act as source/drain regions of S2N driver transistor. Parts of GND node 87 and S2N node 86 are formed to extend parallel to each other. A gate electrode 85 of S2N driver transistor is formed to intersect with those parts of GND node 87 and S2N node 86 which extend to be opposed to each other. A gate insulating film is formed under gate electrode 85, though not shown. S2N driver transistor is formed of gate electrode 85, the gate insulating film, and GND node 87 and S2N node 86 as source/drain regions.

Various patterns of arrangements of the sense amplifier driver transistors (S2N driver transistor 7 (see FIG. 3) and S2P driver transistor 8 (see FIG. 3) to be arranged in S2N region 18, dispersed S2N regions 19, 20 and concentrated S2P region 17) in the semiconductor memory device such as DRAM can be contemplated in accordance with miniaturization of the semiconductor memory device. Description thereof will be made specifically with reference to FIGS. 12–14, which correspond to FIG. 4.

Figure 12:
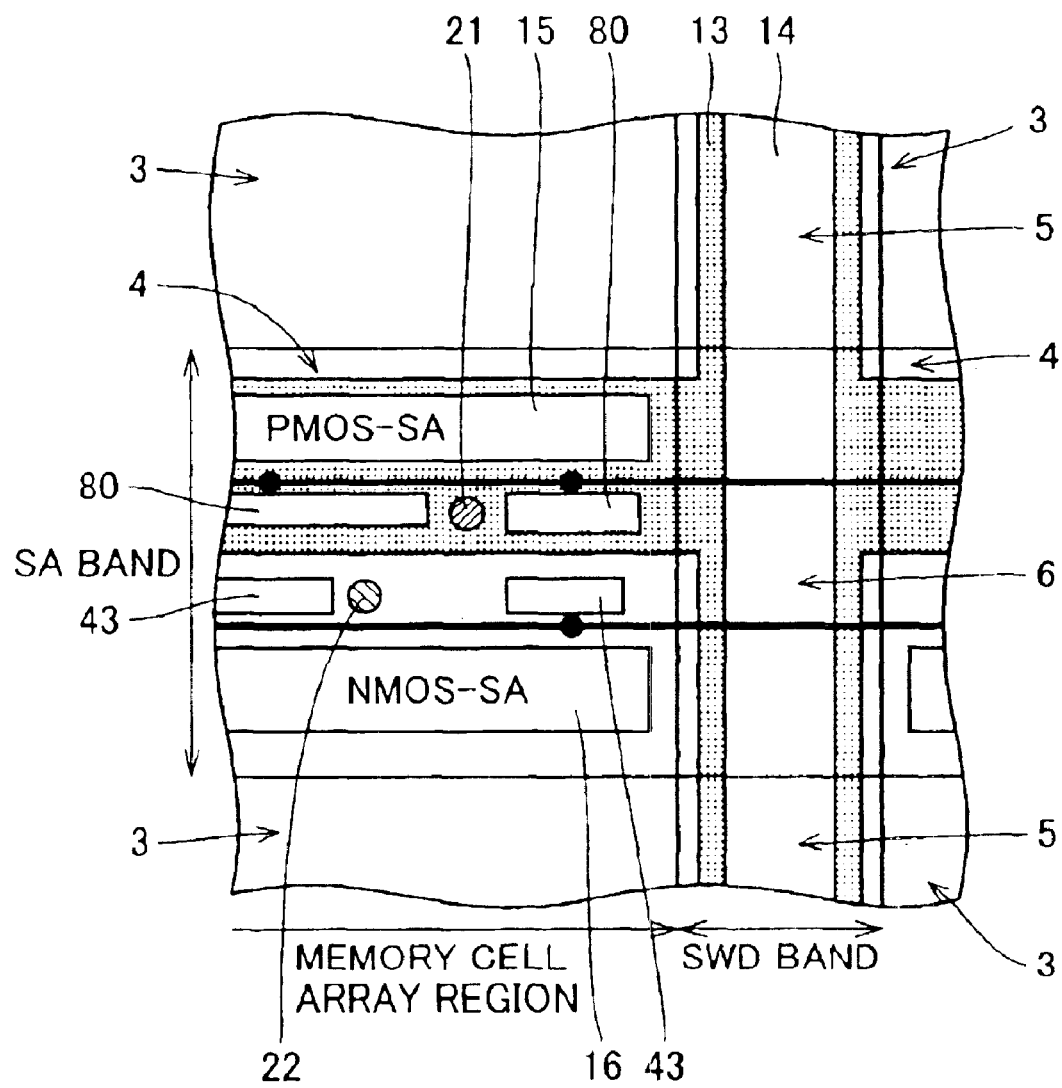
FIGS. 12 to 14 are schematic views of semiconductor memory devices as reference examples illustrating arrangement patterns of a sense amplifier driver transistor.

Referring to FIG. 12, a first arrangement pattern is such that regions 15, 16 with the sense amplifier transistors as well as dispersed S2P regions 80 with S2P driver transistors and dispersed S2N regions 43 with S2N driver transistors are arranged in sense amplifier region 4. $V_{DDS}$ fixing portion 21 and $V_{BB}$ fixing portion 22 are also arranged in sense amplifier region 4. Therefore, there has been a limit on reduction of the area of sense amplifier region 4.

Figure 13:
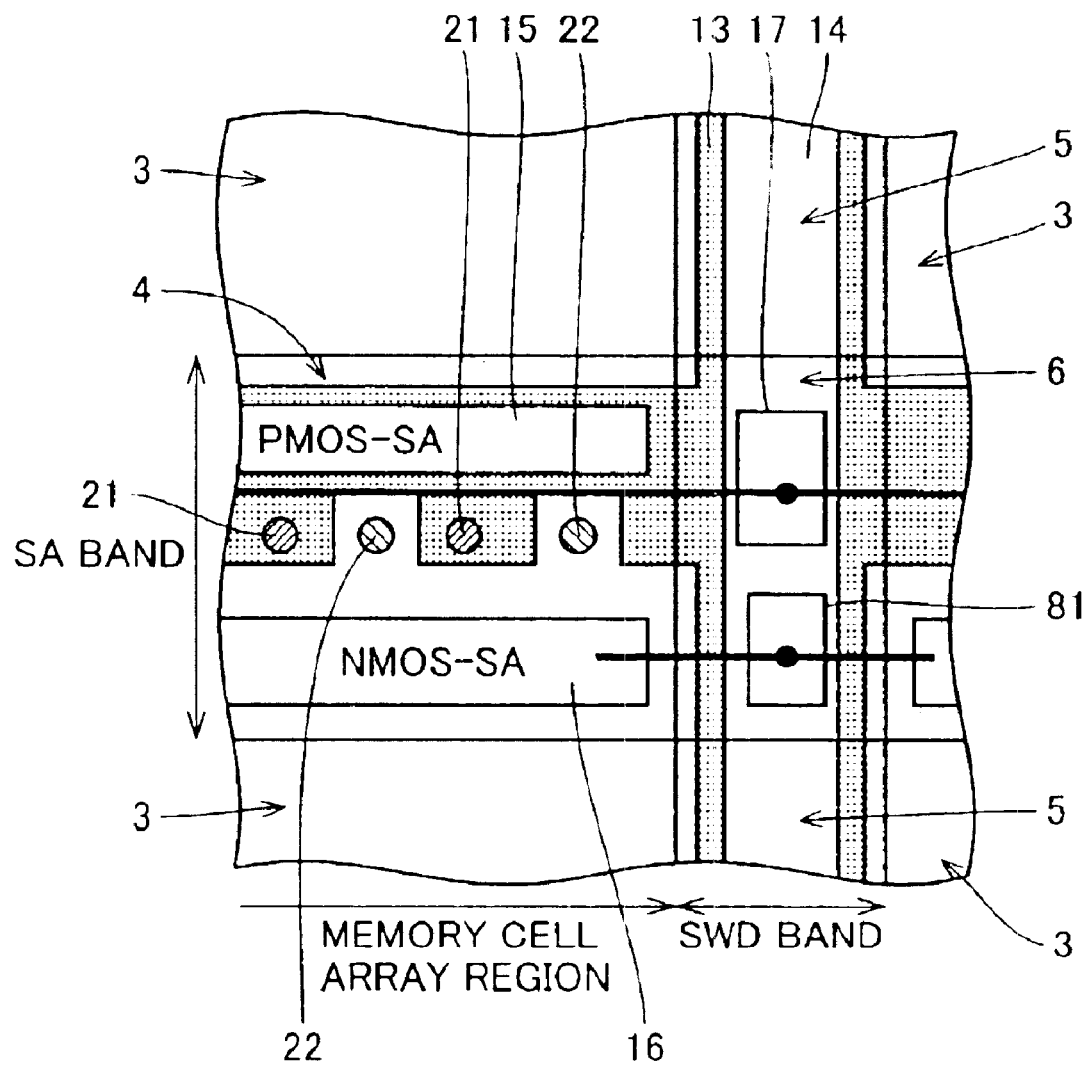

Referring to FIG. 13, a second arrangement pattern is such that S2N driver transistors and S2P driver transistors are all concentrated in cross region 6. In the semiconductor memory device shown in FIG. 13, concentrated S2P region 17 and concentrated S2N region 81 are formed in cross region 6. Furthermore, in the semiconductor memory device shown in FIG. 13, $V_{DDS}$ fixing portion 21 and $V_{BB}$ fixing portion 22 are arranged in sense amplifier region 4.

Figure 14:
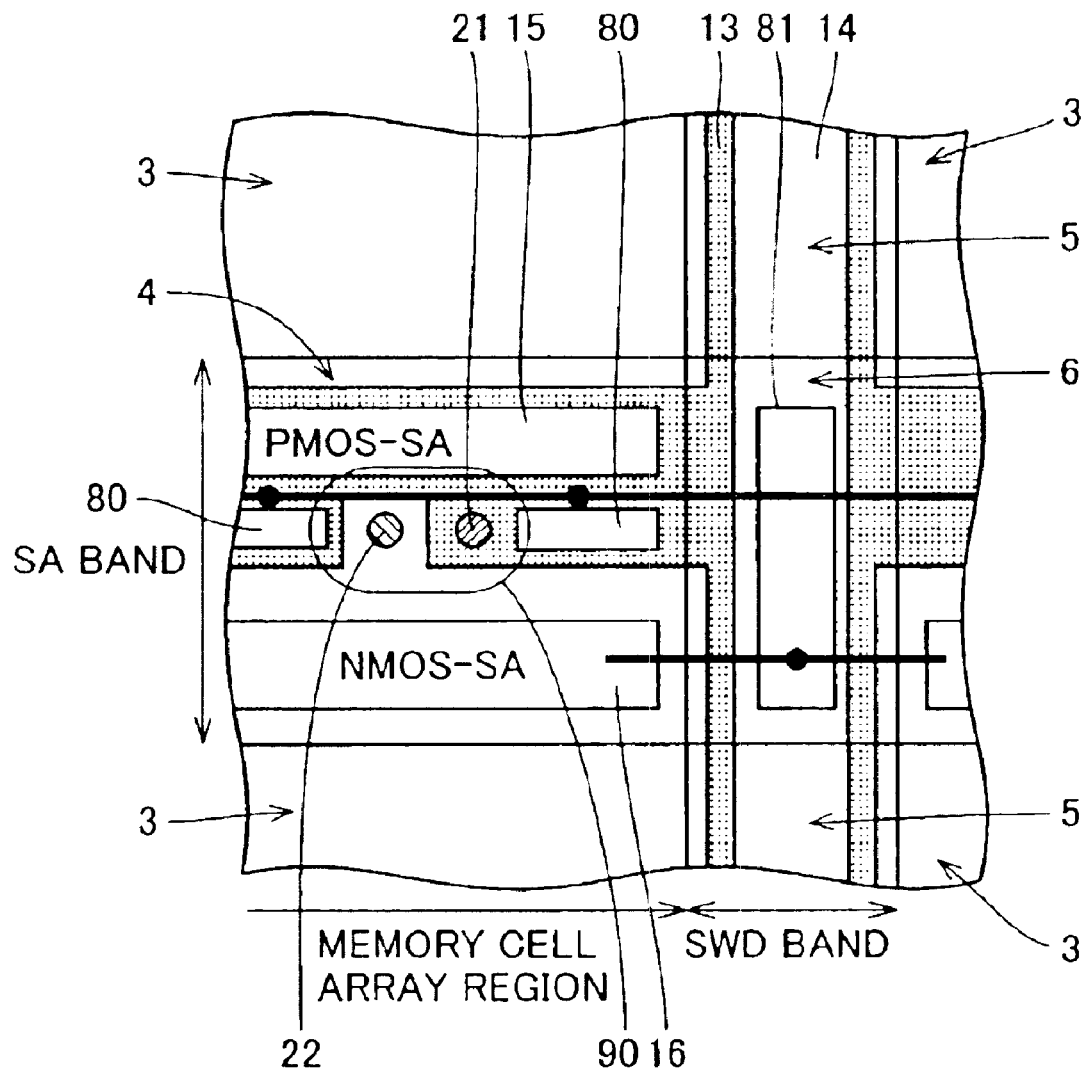

Referring to FIG. 14, a third arrangement pattern is such that concentrated S2N region 81 with S2N driver transistors is arranged in cross region 6 while dispersed S2P regions 80 are arranged in sense amplifier region 4 so that S2P driver transistors are dispersedly arranged in sense amplifier region 4. In this case, $V_{DDS}$ fixing portion 21 and $V_{BB}$ fixing portion 22 are arranged in a region (a portion denoted with a region 90) between dispersed S2P regions 80 in sense amplifier region 4.

Of three patterns described above, the smallest layout area of the sense amplifier can be realized by the second arrangement pattern (that is, the pattern in which S2N driver transistors and S2P driver transistors are concentratedly arranged in cross region 6 as shown in FIG. 13).

Recently, however, a lower resistance of a gate electrode has been realized by application of polymetal gate electrode and improvement in tungsten polycide film in a transistor forming a semiconductor memory device. Therefore the number of division in the word line (WL) direction tends to be reduced. Furthermore, an SWD band (subdecoder region 5) has its width narrowed because of shallower N well and the like. Therefore, a semiconductor memory device that has been mass-produced or developed has a smaller total area of cross region 6. It has been more and more difficult to all the required sense amplifier driver transistors (S2N driver transistor and S2P driver transistor) only in cross region 6.

Usually, a sense amplifier transistor, an I/O gate, a BLI transistor, a BLEQ transistor, and the like are arranged as main components in sense amplifier region 4. In sense amplifier region 4, these components are arranged in a pitch direction. Therefore it is usually difficult to arrange additional components including extra transistors in sense amplifier region 4.

In the second arrangement pattern shown in FIG. 13 (the pattern in which the driver transistors are concentratedly arranged in cross region 6), $V_{DDS}$ fixing portion 21 and $V_{BB}$ fixing portion 22 as well potential fixing portions are arranged in sense amplifier region 4. In other words, in the semiconductor memory device shown in FIG. 13, the area of sense amplifier region 4 has been increased in order to arrange $V_{DDS}$ fixing portion 21 and $V_{BB}$ fixing portion 22 in sense amplifier region 4.

In the third arrangement pattern shown in FIG. 14, the number of well potential fixing portions is reduced, while $V_{BB}$ (back bias of a sense amplifier and a memory cell) P well fixing ($V_{BB}$ fixing portion 22), $V_{DDS}$ N well fixing ($V_{DDS}$ fixing portion 21), S2P sense amplifier driver transistor (dispersed S2P region 80) are arranged in line in this order in the direction in which the sense amplifier band (SA band) extends. In this manner, a width corresponding to one transistor or one well potential fixing portion (a width in a direction normal to the SA band extending direction) is secured, so that all the well potential fixing portions required in the memory cell and sense amplifier can be arranged in sense amplifier region 4, ensuring a region sufficient to arrange the sense amplifier drivers.

In the arrangement pattern as shown in FIG. 14, the N well fixing portion ($V_{DDS}$ fixing portion 21) and the P well fixing portion ($V_{BB}$ fixing portion 22) are adjacent to each other in sense amplifier region 4 as shown in region 90 in FIG. 14. In region 90, the shape of the well boundary portion is thus concave/convex.

Here, the sense amplifier transistor needs to have a threshold voltage that is equal between a pair of transistors respectively connected to a bit line pair (BL, ZBL). As a result of study, however, the inventor has found that the threshold voltage of the transistor is shifted (varied) if the distance from the well boundary to the channel regions of a plurality of transistors is not more than 2 $\mu$m and if the distances are different among the transistors. Specific description will be made with reference to FIGS. 7–9. FIG. 8 shows data for N-channel MOS transistor and FIG. 9 shows data for P-channel MOS transistor.

Figure 7:
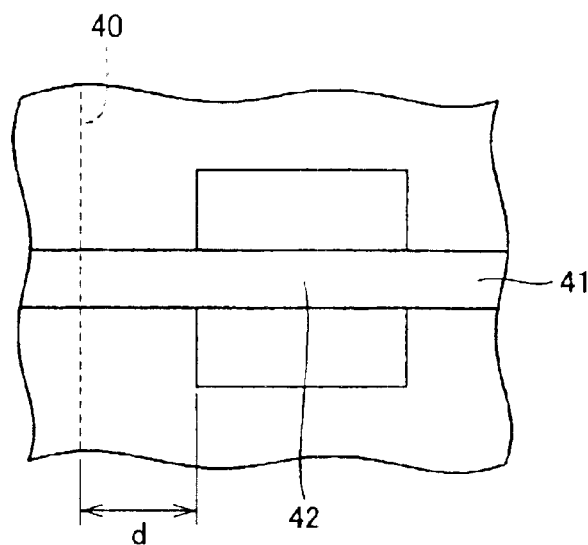
FIG. 7 is a planar schematic view illustrating the relation between the threshold voltage and the distance from the well boundary to the channel region.
Figure 8:
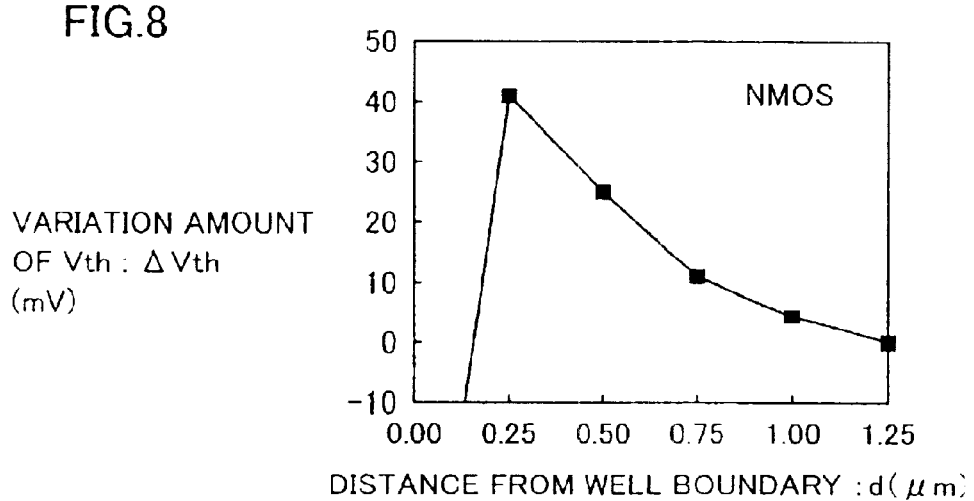
FIG. 8 is a graph showing the relation between a distance d ($\mu$m) from the well boundary to the channel region and a variation amount ($\Delta V_{th}$) of threshold voltage $V_{th}$ (mV).

Referring to FIG. 7, consider a case where a field effect transistor including a gate electrode 41 is formed to be adjacent to a well boundary 40. The distance between a channel region 42 and well boundary 40 of the field effect transistor is represented by d. With distance d being varied, as shown in FIGS. 8 and 9, the threshold voltage varies. In FIGS. 8 and 9, the abscissa shows distance d from well boundary 40 (see FIG. 7) to channel region 42 (see FIG. 7). The unit of distance d is $\mu$m. The ordinate in the graph in FIGS. 8 and 9 shows a variation amount $\Delta V_{th}$ of the threshold voltage. The unit of variation amount of threshold voltage is mV. As can be seen from FIGS. 8 and 9, the threshold voltage of the transistor varies with distance d from the well boundary to the channel region being varied.

The data of the line graph shown in FIG. 8 was obtained from a field effect transistor using arsenic (As) as a conductive impurity in the source/drain region, having a gate length L=0.27 $\mu$m and a gate width W=2 $\mu$m. The source/drain region were formed by implanting arsenic into the main surface of the semiconductor substrate in a first implantation process (an implantation process with an implantation energy of 70 KeV ($1.12\times10^{-14}$ J) and a dose amount of $4.3\times10^{12}/cm^2$) and in a second implantation process (an implantation process with an implantation energy of 15 KeV ($2.40\times10^{-15}$ J) and a dose amount of $1\times10^{12}/cm^2$).

Figure 9:
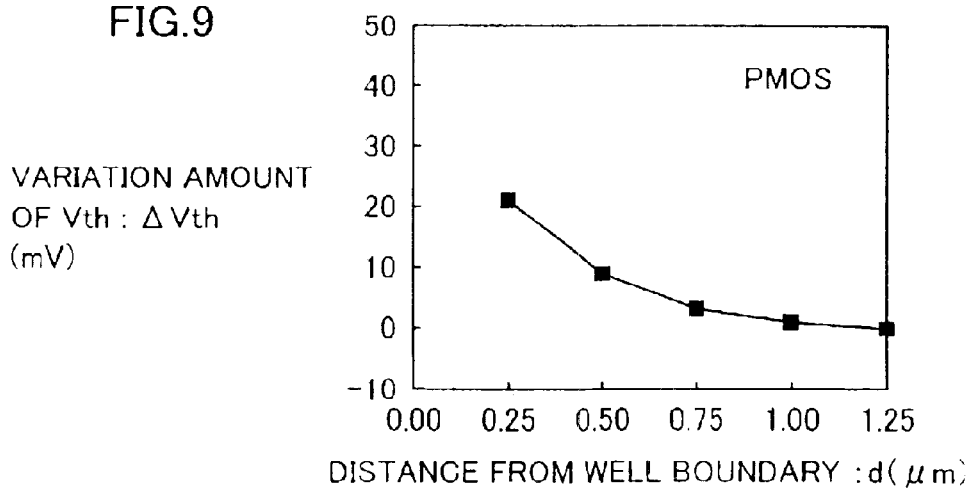
FIG. 9 is a graph showing the relation between distance d from the well boundary to the channel region and variation amount ($\Delta V_{th}$) of threshold voltage.

The data of the line graph shown in FIG. 9 was obtained from a field effect transistor using boron (B) as a conductive impurity in the source/drain region, having a gate length L=0.27 $\mu$m and a gate width W=2 $\mu$m. The source/drain region was formed by implanting boron into the main surface of the semiconductor substrate under the implantation conditions of an implantation energy of 15 KeV ($2.40\times10^{-15}$ J) and a dose amount of $1.1\times10^{13}/cm^2$.

It is noted that N-channel sense amplifier transistor can avoid the problem described above by changing its arrangement, that is, by inserting an I/O gate between the P-channel sense amplifier transistor and the N-channel sense amplifier transistor. It is, however, difficult to employ the method as described above to avoid the problem, in P-channel sense amplifier transistor. The variations in threshold voltage are significant in a semiconductor memory device such as DRAM operated with a lower voltage such as 1.8 V or 1.5 V.

Unlike the semiconductor device having the arrangement pattern as described above, DRAM as a semiconductor memory device in accordance with the present invention has dispersed S2N regions 19, 20 and S2N region 18 that are dispersedly arranged in subdecoder region 5 and cross region 6, respectively, as shown in FIG. 4, in order to secure the area of the region in which all the driver transistors are arranged, without increasing the area of cross region 6. As a result, the area of sense amplifier region 4 and thus the chip area of DRAM as a whole can be reduced.

In DRAM in accordance with the present invention, sense amplifier region 4 is not provided with a driver transistor or a well potential fixing portion, so that the respective distances from well boundaries 60a, 60b to a plurality of sense amplifier transistors (the channel regions thereof) formed in region 15 labeled with PMOS-SA can be made approximately equal. Furthermore, the respective distances from well boundary 60b to a plurality of sense amplifier transistors (the channel regions thereof) formed in region 16 labeled with NMOS-SA can be made approximately equal. As a result, the problem of the threshold voltage variations as described above can be prevented. In other words, the variations of the threshold voltages (the threshold voltages of the sense amplifier transistors constituting a sense amplifier) caused by the variations of distances between well boundaries 60a, 60b and the channel regions of the sense amplifier transistors can be prevented. Therefore, the chip area of the semiconductor memory device can be reduced, while degradation in characteristic is prevented with a lower voltage operation.

In the semiconductor memory device shown in FIGS. 4 and 5, not only the sense amplifier drivers (that is, concentrated S2P region 17, S2N region 18 and dispersed S2N regions 19, 20) but also $V_{DDS}$ fixing portion 21 and $V_{BB}$ fixing portion 22 are arranged in the region other than sense amplifier region 4, that is, the end portion of subdecoder region 5 and memory cell array region 3, thereby reducing the size of sense amplifier region 4 as compared with three patterns described above. It is noted that $V_{BB}$ fixing portion 22 may be arranged within subdecoder region 5.

In the semiconductor memory device shown in FIGS. 4 and 5, dispersed S2N regions 19, 20 are arranged in subdecoder region 5. In the semiconductor memory device in accordance with the present invention, the region in which dispersed S2N regions 19, 20 are arranged is in the vicinity of bottom N well 30 (see FIG. 5). Conventionally, no transistor has been arranged in the vicinity of bottom N well 30 in this manner. Conventionally, a decouple capacitor has often been arranged in such a place.

In the semiconductor memory device in accordance with the present invention, however, the source/drain region implanted with an N-type conductive impurity of S2N driver transistor formed in dispersed S2N region 19, 20 has a depth reduced by a lower implantation energy of impurity. As a result, a short margin between bottom N well 30 and the source/drain region of S2N driver transistor described above can be improved. Here, with phosphorous (P) as a conductive impurity, an implantation energy of 15 KeV, and a dose amount of $1.7\times10^{13}/cm^2$, 0.3 $\mu$m of the depth from the main surface of the semiconductor substrate to the lower portion of the source/drain region can be achieved.

As a result, S2N driver transistor (dispersed S2N region 19, 20) can be arranged at a position closer than the conventional, about 2 μm from bottom N well 30 (see FIG. 5). In this way, S2N driver transistor (dispersed S2N region 19, 20) is arranged in place of the conventionally arranged decouple capacitor, so that it is possible to substantially prevent increase in the area of this region due to the arrangement of S2N driver transistor in subdecoder region 5. As a result, in DRAM in accordance with the present invention, the total chip size can be made smaller (than DRAM having the arrangement pattern as shown in FIG. 14, for example). It is noted that the inventor has estimated that the chip area in DRAM in accordance with the present invention may be reduced by about 0.5% from that of DRAM having the arrangement pattern as shown in FIG. 14, depending on the prerequisite.

The sense amplifier driver transistors (S2N driver transistor and S2P driver transistor) are arranged in the region other than sense amplifier region 4, thereby simplifying the configuration in the inside of sense amplifier region 4. Therefore, a smaller sense margin resulting from uneven noises from the driver transistor and the like onto nodes 37, 38 in FIG. 3 can be prevented.

Now, if S2N driver transistors, S2P driver transistors and the like are dispersedly arranged in sense amplifier region 4 as shown in FIG. 14, the drain side of the driver transistor will be an S2 node, depending on the arrangement of the transistor. Therefore, coupling noise will act on only node 38 (SA node) or node 37 (SA node) adjacent to the driver transistor shown in FIG. 3. In order to prevent the effect of such a noise, the sense amplifier driver transistor may be laid out to be symmetric with respect to nodes 37, 38.

In order to arrange the sense amplifier driver transistors in this manner, however, the area of the region for arranging the transistors has to be increased, thereby increasing the chip area. In order to realize the layout as described above without increasing the chip area, a process margin has to be reduced. Specifically, the distance between interconnections or contact holes need to be further reduced, for example, by arranging an interconnection contact between interconnections of a bit line pair.

Figure 10:
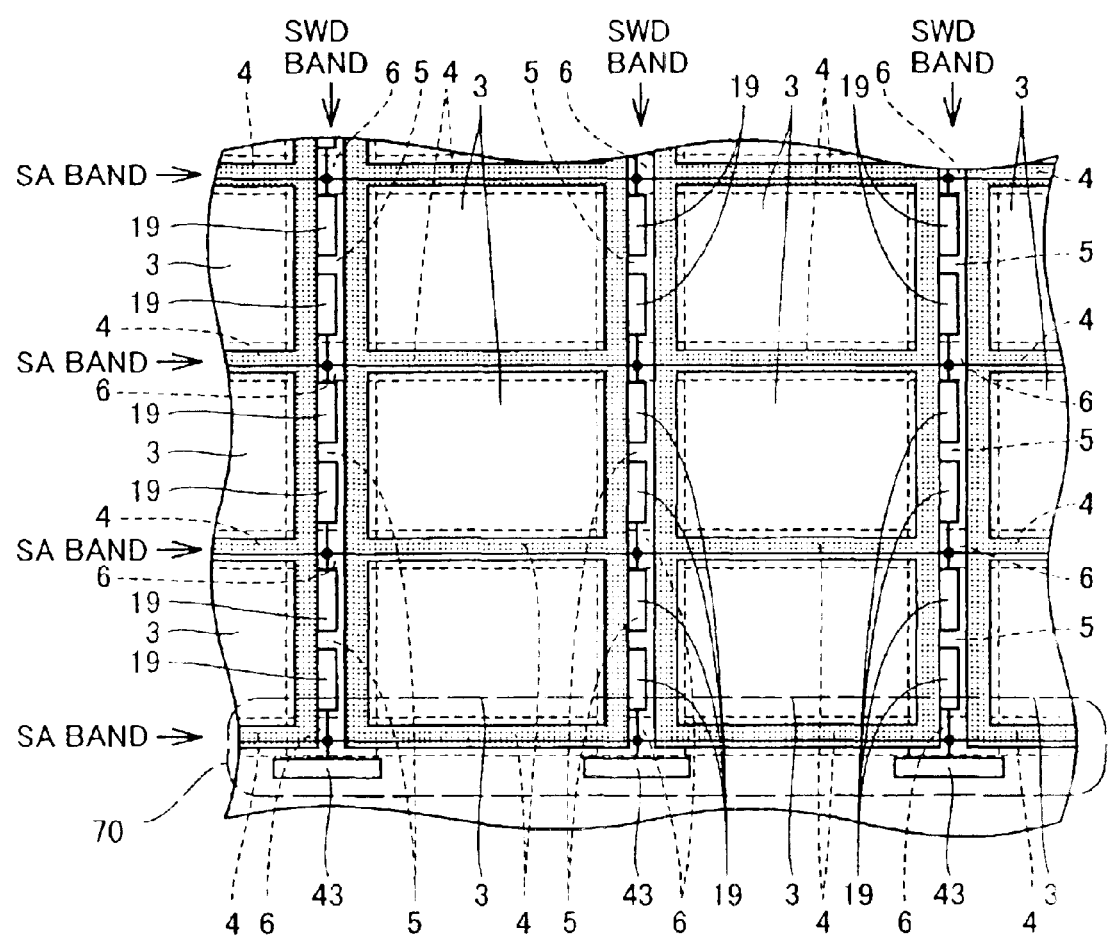
FIG. 10 is a partial schematic view showing an end portion of a memory cell mat of DRAM in accordance with the present invention.

Referring to FIG. 10, in DRAM as a semiconductor memory device in accordance with the present invention, two dispersed S2N regions 19 are arranged in one subdecoder region 5 and are connected to respective sense amplifiers respectively arranged in sense amplifier regions 4 on the opposite sides. In a memory cell mat end portion 70, subdecoder region 5 does not exist on the outer side of the memory cell mat beyond cross region 6 as compared with a central portion of the memory cell mat, which makes it difficult to arrange dispersed S2N region 19 in a similar manner as the central portion of the memory cell mat. Therefore, for a shortage of S2N driver transistors, the dimension of S2N region 18 (see FIG. 4) in cross region 6 is increased or dispersed S2N region 43 is arranged to extend in the same direction as SA band on the outer side of the memory cell mat in the memory cell mat end portion 70 as shown in FIG. 10, so that a required number of S2N transistors can be ensured.

It is noted that only one large, dispersed S2N region 19 may be arranged in subdecoder region 5 to connect to only one of cross regions 6 on the opposite sides of subdecoder region 5. In this case, the interconnection length up to the furthest position in dispersed S2N region 19 becomes longer as seen from cross region 6. Therefore, the parasitic resistance of an upper layer metal interconnection extending from cross region 6 to S2N region 19 becomes larger than when dispersed S2N regions 19 are dispersedly arranged on the opposite sides of cross region 6 as in FIG. 4.

As to $V_{BB}$ fixing portion 22 shown in FIGS. 4 and 5, when $V_{BB}$ fixing portion 22 is arranged in a dummy portion of a memory cell in memory cell array region 3 (see FIG. 4) or subdecoder region 5, the area of memory cell array region 3 or subdecoder region 5 will be at least as large as $V_{BB}$ fixing portion 22 was arranged in sense amplifier region 4. In addition, it becomes difficult to ensure the minimum area for patterning in forming a trench isolation insulating film 46 (see FIG. 11) while arranging a word line. Therefore, as shown in FIG. 11, the distance between trench isolation insulating films 46 is made sufficiently larger than the distance between word lines 47, so that $V_{BB}$ fixing portion 22 is arranged between word lines 47.

Figure 11:
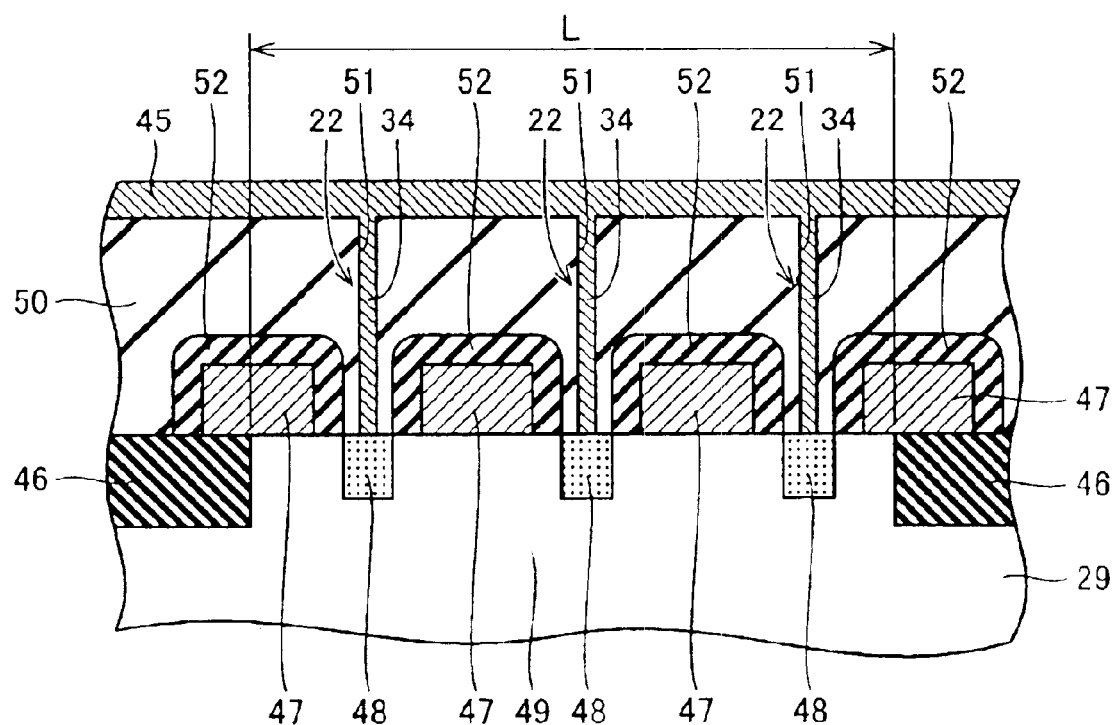
FIG. 11 is a partial cross sectional view schematically showing a $V_{BB}$ fixing portion shown in FIG. 4.

Referring to FIG. 11, trench isolation insulating films 46 are formed spaced apart from each other with a distance L on the main surface of semiconductor substrate 29. Between trench isolation insulating films 46, a P well 49 formed in the main surface of semiconductor substrate 29 is exposed. Word lines 47 are formed to extend approximately parallel to each other in the direction vertical to the plane in this figure at prescribed intervals on the main surface of semiconductor substrate 29. A P-type conductive impurity diffusion region 48 is formed in P well 49 between word lines 47. An insulating film 52 is formed to cover word line 47. An interlayer insulating film 50 is formed on insulating film 52. In interlayer insulating film 50, a contact hole 51 is formed at a region between word lines 47. Contact hole 51 is formed to reach P-type conductive impurity diffusion region 48 positioned between word lines 47. Contact hole 51 is filled with conductor plug 34. Conductor plug 34 is electrically connected to a $V_{BB}$ interconnection 45 formed on interlayer insulating film 50.

In this way, $V_{BB}$ fixing portion 22 can be formed. In such a well potential fixing method, word line 47 will have as a parasitic element an accumulation capacitor (a capacitor having the same shape as an MOS capacitor, with the source/drain region having a potential equal to that of the well, and providing a capacitance between the well and the gate without creating an inversion layer). Given the capacitance of word line 47 as a whole, however, the capacitance of this accumulation capacitor is at a relatively ultrasmall level, which is not so significant. The division ratio between the sense amplifier direction and the subdecoder direction is about 2:1. Therefore the arrangement of $V_{BB}$ fixing portion 22 between word lines 47 in this manner can reduce the chip area as a whole approximately by 1.5%. The reduction rate of about 1.5% is derived from the following calculation. In the following, the calculation will be made for a memory cell 1 mat.

Figure 2:
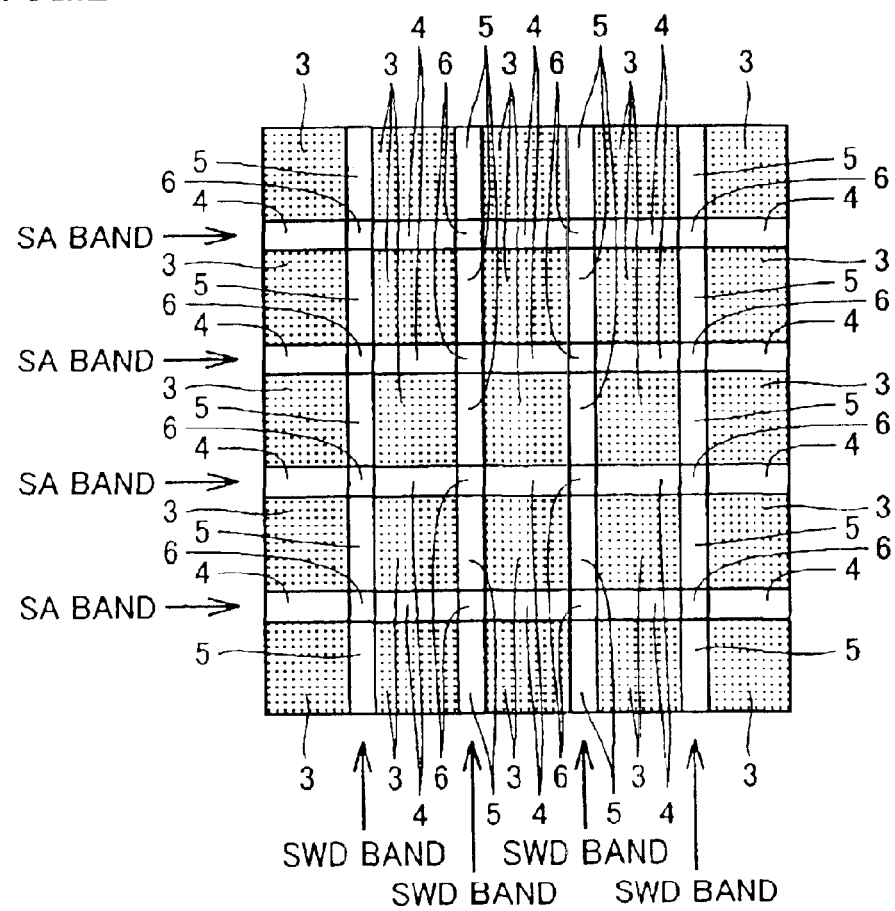
FIG. 2 is a partially enlarged schematic view showing a region II in the chip shown in FIG. 1.

First, assume that the conventional DRAM as a comparative example has a memory cell of 200 μm×100 μm in size, a SA band shown in FIG. 2 of 19 μm in width (the width in the vertical direction in FIG. 2), and an SWD band shown in FIG. 2 of 20 μm in width (the width in the horizontal direction in FIG. 2). The area $S_0$ of one pitch of the memory cell with SA band and SWD band will thus be (200+20)× (100+19)=26180 (μm²). By contrast, in DRAM described above in the present invention, where a memory cell has a size of 200 μm×100 μm, the width of SA band shown in FIG. 2 is 16.2 μm and the width of SWD band in FIG. 2 is 20.34 μm. The area $S_1$ of one pitch of the memory cell with SA band and SWD band will thus be (200+20.34)×(100+16.2)= 25604 (μm²). Therefore, the rate of reduction from area $S_0$ of one pitch in the comparative example DRAM to area $S_1$ of one pitch in DRAM in the present invention is $(S_0-S_1)/S_0 \times 100=2.2\%$. Given that the cell occupation rate is 66%, the reduction rate of the area in the DRAM chip as a whole is 2.2%×0.66=1.5%.

In DRAM shown in FIG. 4, S2P driver transistors 8 (see FIG. 3) are concentratedly arranged in cross region 6 while S2N driver transistors 7 (see FIG. 3) are dispersedly arranged in two subdecoder regions 5. Alternatively, S2P driver transistor 8 and S2N driver transistor 7 may be interchanged in arrangement. More specifically, S2N driver transistors 7 may be concentratedly arranged in cross region 6 while S2P driver transistors 8 may be dispersedly arranged in subdecoder regions 5. In this case, the similar effect results.

To sum up the characteristic configuration of DRAM as an exemplary semiconductor memory device in accordance with the present invention as described above, DRAM as a semiconductor memory device in accordance with the present invention includes memory cell array region 3, sense amplifier region 4, subdecoder region 5, and cross region 6 as an intersection region, which are formed on the main surface of semiconductor substrate 29 (see FIG. 5). Sense amplifier region 4 is arranged adjacent to memory cell array region 3 and is provided therein with P-channel transistors 9, 11 (see FIG. 3) and N-channel transistors 10, 12 (see FIG. 3) as a plurality of sense amplifier-forming elements. In other words, region 15 in which P-channel transistors 9, 11 are formed and region 16 in which N-channel transistors 10, 12 are formed are arranged in sense amplifier region 4. Subdecoder region 5 arranged adjacent to memory cell array region 3 is a region different from sense amplifier region 4. Subdecoder region 5 is arranged adjacent to memory cell array region 3 and is positioned in a direction different from that of sense amplifier region 4 as seen from memory cell array region 3. Cross region 6 is adjacent to memory cell array region 3 and is arranged to connect sense amplifier region 4 to subdecoder region 5. A plurality of S2N driver transistors 7 (see FIG. 3) and S2P driver transistors 8 (see FIG. 3) as a plurality of sense amplifier driver elements are formed in subdecoder region 5 (in other words, dispersed S2N regions 19, 20 in which the sense amplifier driver elements described above are formed are arranged in subdecoder region 5). S2N driver transistor 7 and S2P driver transistor 8 are used to operate the sense amplifier (to drive the sense amplifier).

Since subdecoder region 5 is utilized as a region in which sense amplifier driver elements are arranged as described above in this manner, the area of sense amplifier region 4 can be reduced as compared with the case where the sense amplifier driver element is arranged with the sense amplifier-forming element in sense amplifier region 4 (the layout as in the semiconductor memory device shown in FIG. 12, for example). As a result, the chip size of DRAM can be reduced.

Furthermore, since the sense amplifier driver element is arranged in the region (subdecoder region 5) other than sense amplifier region 4, the degree of freedom of the arrangement of the sense amplifier-forming element in sense amplifier region 4 can be increased. Therefore, as to a plurality of elements (the elements formed in regions 15, 16) that form a sense amplifier, the distances between well boundaries 60a, 60b between N well 13 and P well 14 and a plurality of elements can be made substantially equal.

The aforementioned DRAM in accordance with the present invention may include a plurality of memory cell array regions 3, sense amplifier regions 4, subdecoder regions 5, and cross regions 6 formed on the main surface of semiconductor substrate 29 (see FIG. 5) as can be seen from FIG. 2. On the main surface of semiconductor substrate 29, a plurality of memory cell array regions 3 may be arranged in matrix, spaced apart from each other in the row direction (the SA band extending direction) and the column direction (the SWD band extending direction). A plurality of sense amplifier regions 4 may be arranged respectively in a plurality of gaps that separate a plurality of memory cell array regions 3 in the column direction. A plurality of subdecoder regions 5 may be arranged respectively in a plurality of gaps that separate a plurality of memory cell array regions 3 in the row direction. A plurality of cross regions may be arranged respectively at a plurality of intersection regions of a series of gaps (SWD band) that separate a plurality of memory cell array regions 3 in the column direction and a series of gaps (SA band) that separate a plurality of memory cell array regions 3 in the row direction.

As shown in FIG. 10, in the end portion (memory cell mat end portion 70 in FIG. 10) in the column direction (the SWD band extending direction) of memory cell mat 2 (see FIG. 1) having memory cell array regions 3 arranged in matrix, the sense amplifier driver elements (S2N driver transistors 7 (see FIG. 3) formed in dispersed S2N regions 19, 43) are dispersedly arranged in subdecoder region 5 adjacent to memory cell mat end portion 70 and in the region (the region on the side opposite to subdecoder region 5 as seen from cross region 6 positioned in memory cell mat end portion 70) on the outer side of the memory cell mat region.

In this case, as to the sense amplifier positioned in memory cell mat end portion 70, the sense amplifier driver elements (i.e. S2N driver transistors 7) can be dispersedly arranged in the portion other than sense amplifier region 4, ensuring that the area of sense amplifier region 4 can be reduced.

DRAM in accordance with the present invention includes, as shown in FIG. 2, a plurality of memory cell array regions 3, sense amplifier regions 4, subdecoder regions 5, and cross regions 6 as intersection regions. A plurality of memory cell array regions 3 are arranged in matrix, spaced apart from each other in the row direction (the SA band extending direction) and the column direction (the SWD band extending direction). A plurality of sense amplifier regions 4 are arranged respectively between a plurality of memory cell array regions 3 in the column direction. The sense amplifier-forming elements (P-channel transistors 9, 11 and N-channel transistors 10, 12 shown in FIG. 3) are arranged in sense amplifier region 4. A plurality of sense amplifiers may be arranged in sense amplifier region 4. A plurality of subdecoder regions 5 are arranged respectively in the gaps between memory cell array regions 3 in the row direction. A plurality of cross regions 6 are positioned at respective intersections of a plurality of sense amplifier regions 4 in line (SA band) and a plurality of subdecoder regions 5 in line (SWD band). DRAM in accordance with the present invention includes a plurality of sense amplifier driver elements (S2N driver transistors 7 (see FIG. 3) formed in dispersed S2N regions 19, 20 shown in FIG. 4) arranged in subdecoder region 5 for use in the sense amplifier operation.

In DRAM in accordance with the present invention, in the end portion (memory cell mat end portion 70 in FIG. 10) in the column direction (the SWD band extending direction in FIG. 10) of the region (memory cell mat 2 in FIG. 1) in which a plurality of memory cell array regions 3 are arranged, the sense amplifier driver elements (S2N driver transistors 7 (see FIG. 3) formed in dispersed S2N regions 19, 43 shown in FIG. 10) may be dispersedly arranged in subdecoder region 5 adjacent to the end portion (memory cell mat end portion 70) and the region (the region positioned on the side opposite to subdecoder region 5 as seen from cross region 6 in memory cell mat end portion 70) on the outer side of the region (memory cell mat 2) in which a plurality of memory cell array regions are arranged. Specifically, the sense amplifier driver elements may dispersedly be arranged in dispersed S2N region 19 of subdecoder region 5 adjacent to memory cell mat end portion 70 and in dispersed S2N region 43 positioned on the side opposite to dispersed S2N region 19 as seen from cross region 6.

In the aforementioned DRAM, the sense amplifier driver elements (S2N driver transistors 7 formed in S2N region 18 and dispersed S2N regions 19, 20, and S2P driver transistors 8 formed in concentrated S2P region 17) may dispersedly be arranged in subdecoder region 5 and cross region 6. In this case, the area of the region for forming the sense amplifier driver elements such as S2N driver transistor 7 and S2P driver transistor 8 can sufficiently be secured.

The aforementioned DRAM may include N well 13 and P well 14 as conductive impurity diffusion regions formed in the semiconductor substrate as well as conductor plugs 33, 34 as potential-fixing conductors, which form $V_{DDS}$ fixing portion 21 and $V_{BB}$ fixing portion 22, respectively. Each of N well 13 and P well 14 may include a portion exposed on the main surface of the semiconductor substrate in subdecoder region 5, as shown in FIG. 5. Conductor plug 33 may be connected to that part of N well 13 which is exposed in subdecoder region 5. Conductor plug 33 may be provided to fix the potential of N well 13. Conductor plug 34 may be connected to that surface part of P well 14 which is exposed in subdecoder region 5.

In this case, the area of sense amplifier region 4 can be reduced as compared with the arrangement of $V_{DDS}$ fixing portion 21 in sense amplifier region 4, as conductor plug 33 (i.e. $V_{DDS}$ fixing portion 21) for fixing the potential of N well 13 is arranged in subdecoder region 5. If $V_{DDS}$ fixing portion 21 is arranged in sense amplifier region 4 as shown in FIG. 14, the distances between the boundary portion between N well 13 and P well 14 and a plurality of sense amplifier-forming elements (P-channel transistors 9, 11 and N-channel transistors 10, 12 constituting a sense amplifier formed in regions 15, 16) in sense amplifier region 4 vary among the elements, depending on the arrangement of $V_{DDS}$ fixing portion 21 or the other elements. As a result, the characteristic of sense amplifier-forming elements may vary as described above. DRAM in accordance with the present invention, however, can avoid the aforementioned problem as $V_{DDS}$ fixing portion 21 is formed in subdecoder region 5 and $V_{BB}$ fixing portion 22 is arranged in subdecoder region 5 or the end portion of memory cell array region 3.

In DRAM in accordance with the present invention, as shown in FIGS. 4 and 10, the sense amplifier driver elements (S2N driver transistors 7) for use in the operation of a sense amplifier (or sense amplifiers) formed in one of a plurality of sense amplifier regions 4 may dispersedly be arranged in two subdecoder regions 5 positioned such that cross region 6 adjacent to one of sense amplifier regions 4 is interposed therebetween (a plurality of S2N driver transistors 7 are arranged in dispersed S2N regions 19, 20 dispersedly arranged in two subdecoder regions 5).

In this case, the distance from the driver transistor at the end portion of dispersed S2N region positioned farthest from cross region 6 to that cross region 6 can be made shorter than when dispersed S2N region in which all the S2N driver transistors connected to cross region 6 are arranged is formed only in one of two subdecoder regions 5 positioned with cross region 6 interposed therebetween. Therefore, the interconnection length between the S2N driver transistor positioned farthest from cross region 6 and cross region 6 can be made shorter than when all the S2N driver transistors are arranged in one of two subdecoder regions 5 as described above. As a result, the parasitic resistance in connection with the interconnection described above can be reduced as compared with the case where all the S2N driver transistors are arranged in one of two subdecoder regions 5.

In the aforementioned DRAM, as shown in FIG. 4, in sense amplifier region 4, the main surface of the semiconductor substrate is formed of a first conductivity type region (N well 13) and a second conductivity type region (P well 14). Consider a plurality of particular elements formed in either the first conductivity type region or the second conductivity type region (for example, a plurality of N-channel transistors 10, 12 (see FIG. 3) formed in region 16 labeled with NMOS-SA in FIG. 4), of a plurality of sense amplifier-forming elements. The respective distances from the boundary portion (well boundary 60b) between the first conductivity type region (N well 13) and the second conductivity type region (P well 14) to N-channel transistors 10, 12 as particular elements formed in region 16 may be substantially equal. From a different viewpoint, the respective distances from the boundary portion (well boundary 60b) to the channel regions of N-channel transistors 10, 12 as particular elements formed in region 16 may be substantially equal. In other words, outer peripheral portion 62 of region 16 provided with N-channel transistors 10, 12 and well boundary 60b are arranged approximately parallel to each other, so that the distance between outer peripheral portion 62 and well boundary 60b is approximately constant. In this manner, variations in electric characteristic such as threshold voltage can be reduced for N-channel transistors 10, 12, as described with reference to FIGS. 7–9.

That the respective distances from the boundary portion (well boundary 60b) between the first conductivity type region (N well 13) and the second conductivity type region (P well 14) to N-channel transistors 10, 12 as particular elements formed in region 16 are approximately equal (substantially equal) means, for example, that variations of the distances from boundary portion 60b to N-channel transistors 10, 12 as particular elements (a ratio of a difference between the distance for the particular element and an average value of the distances from boundary portion 60b to the particular elements, to the average value) is 10% or less, preferably 5% or less, more preferably 2% or less. That the distance between outer peripheral portion 62 and well boundary 60b is approximately constant (substantially constant) means, for example, that where the distance between outer peripheral portion 62 and well boundary 60b is measured at a plurality of positions, variations of a plurality of measured distances (a ratio of a difference between the distance at each of the measured positions and an average value of a plurality of distances, to the average value) is 10% or less, preferably 5% or less, more preferably 2% or less.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a plurality of memory cell array regions arranged in matrix, spaced apart from each other in a row direction and in a column direction, on a semiconductor substrate;
a plurality of sense amplifier regions each arranged in a gap between said memory array regions in said column direction and provided with a sense amplifier-forming element;
a plurality of subdecoder regions each arranged in a gap between said memory cell array regions in said row direction;
a plurality of intersection regions each positioned at an intersection of said plurality of sense amplifier regions in line and said plurality of subdecoder regions in line; and
a plurality of sense amplifier driver elements each arranged in said subdecoder region located between said intersection regions for use in an operation of a sense amplifier formed by said sense amplifier-forming element.

2. The semiconductor memory device according to claim 1 wherein in an end portion in said column direction of a region provided with said plurality of memory cell array regions, said sense amplifier driver elements are dispersedly arranged in said subdecoder region adjacent to said end portion and a region on the outer side of said region provided with said plurality of memory cell array regions.

3. The semiconductor memory device according to claim 1 wherein said sense amplifier driver elements are dispersedly arranged in said subdecoder region and said intersection region.

4. The semiconductor memory device according to claim 1 further comprising:

a conductive impurity diffusion region formed in said semiconductor substrate and including a portion exposed on a main surface of said semiconductor substrate in said subdecoder region; and
a potential fixing conductor connected to said portion exposed in said subdecoder region for determining a potential of said conductive impurity diffusion region.

5. The semiconductor memory device according to claim 1 wherein said sense amplifier driver elements for use in an operation of a sense amplifier formed in one of a plurality of said sense amplifier regions are dispersedly arranged in two of said subdecoder regions positioned such that said intersection region adjacent to said one of said sense amplifier regions is interposed therebetween.

6. The semiconductor memory device according to claim 1 wherein
in said sense amplifier region, a main surface of said semiconductor substrate includes a first conductivity type region and a second conductivity type region that are adjacent to each other,
in said sense amplifier region, a plurality of said sense amplifier-forming elements are arranged in one of said first conductivity type region and said second conductivity type region, and
for a plurality of particular elements formed in one of said first conductivity type region and said second conductivity type region, of said plurality of sense amplifier-forming elements, respective distances from a boundary portion between said first conductivity type region and said second conductivity type region to said particular elements are substantially equal.

* * * * *